United States Patent
Bedell et al.

(10) Patent No.: US 9,666,742 B2
(45) Date of Patent: May 30, 2017

(54) SOLAR CELL STRUCTURES HAVING III-V BASE LAYERS

(71) Applicant: International Business Machines Corporation, Armonk, NY (US)

(72) Inventors: Stephen W. Bedell, Wappingers Falls, NY (US); Bahman Hekmatshoartabari, Mount Kisco, NY (US); Devendra K. Sadana, Pleasantville, NY (US); Davood Shahrjerdi, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/982,991

(22) Filed: Dec. 29, 2015

(65) Prior Publication Data
US 2016/0118525 A1   Apr. 28, 2016

Related U.S. Application Data

(62) Division of application No. 14/500,538, filed on Sep. 29, 2014, now Pat. No. 9,246,032, which is a division
(Continued)

(51) Int. Cl.
*H01L 31/00* (2006.01)
*H01L 21/00* (2006.01)
(Continued)

(52) U.S. Cl.
CPC ...... *H01L 31/074* (2013.01); *H01L 31/02167* (2013.01); *H01L 31/022466* (2013.01); *H01L 31/0304* (2013.01); *H01L 31/036* (2013.01); *H01L 31/077* (2013.01); *H01L 31/20* (2013.01); *Y02E 10/50* (2013.01); *Y02E 10/544* (2013.01); *Y02P 70/521* (2015.11)

(58) Field of Classification Search
CPC ..... H01L 31/074; H01L 31/036; H01L 31/20; H01L 31/077; H01L 31/02167; H01L 31/022466; H01L 31/0304
See application file for complete search history.

(56) References Cited

U.S. PATENT DOCUMENTS 4,698,455 A * 10/1987 Cavicchi ........... H01L 31/02242
                                                       136/256
7,030,413 B2 * 4/2006 Nakamura .......... H01L 31/0745
                                                       136/243
(Continued)

FOREIGN PATENT DOCUMENTS

AU   WO 2010102345 A1 *  9/2010  ......... H01L 31/0687

*Primary Examiner* — Thomas L Dickey
*Assistant Examiner* — Damon Hillman
(74) *Attorney, Agent, or Firm* — Louis J. Percello; Otterstedt, Ellenbogen & Kammer, LLP

(57) ABSTRACT

Solar cell structures that have improved carrier collection efficiencies at a heterointerface are provided by low temperature epitaxial growth of silicon on a III-V base. Additionally, a solar cell structure having improved open circuit voltage includes a shallow junction III-V emitter formed by epitaxy or diffusion followed by the epitaxy of $Si_xGe_{1-x}$ passivated by amorphous $Si_yGe_{1-y}$:H.

20 Claims, 5 Drawing Sheets

| LAYERS | REFERENCE STRUCTURE | NEW STRUCTURE 1 | NEW STRUCTURE 2 |
|---|---|---|---|
| $n^+$ a-Si:H | 6nm | 6nm | 6nm |
| i-LAYER (HD=2) | 6nm | – | 6nm |
| i-LAYER (HD=10) | – | 8nm | 8nm |
| GaAs ABSORBER | 2.5μm | 2.5μm | 2.5μm |
| InGaP BSF | 0.2μm | 0.2μm | 0.2μm |

Related U.S. Application Data of application No. 13/193,260, filed on Jul. 28, 2011, now Pat. No. 8,871,620.

(51) Int. Cl.
  *H01L 31/075* (2012.01)
  *H01L 31/074* (2012.01)
  *H01L 31/0304* (2006.01)
  *H01L 31/20* (2006.01)
  *H01L 31/036* (2006.01)
  *H01L 31/077* (2012.01)
  *H01L 31/0216* (2014.01)
  *H01L 31/0224* (2006.01)

(56) References Cited

U.S. PATENT DOCUMENTS

| | | | | |
|---|---|---|---|---|
| 7,375,378 B2 * | 5/2008 | Manivannan | ..... | H01L 31/02168 257/79 |
| 7,951,640 B2 | 5/2011 | Sinha | | |
| 8,624,104 B2 * | 1/2014 | Bedell | ................ | H01L 31/03046 136/255 |
| 8,778,448 B2 * | 7/2014 | Hekmatshoar-Tabari | | H01L 31/03762 427/74 |
| 8,871,620 B2 | 10/2014 | Bedell et al. | | |
| 9,099,585 B2 * | 8/2015 | Hekmatshoar-Tabari | | H01L 31/03762 |
| 9,331,229 B2 * | 5/2016 | Bedell | .................... | H01L 31/075 |
| 2007/0169808 A1 * | 7/2007 | Kherani | .............. | H01L 31/0745 136/258 |
| 2010/0218819 A1 | 9/2010 | Farmer | | |
| 2010/0307572 A1 * | 12/2010 | Bedell | ................ | H01L 31/0725 136/255 |
| 2011/0240997 A1 | 10/2011 | Rockenberger et al. | | |
| 2012/0210932 A1 | 8/2012 | Hekmatshoar-Tabari | | |
| 2013/0014811 A1 | 1/2013 | Bedell | | |
| 2014/0159032 A1 * | 6/2014 | Syllaios | ............ | H01L 27/14618 257/43 |
| 2014/0283902 A1 * | 9/2014 | Heng | ................. | H01L 31/0745 136/255 |
| 2015/0047704 A1 | 2/2015 | Bedell et al. | | |

* cited by examiner

| LAYERS | REFERENCE STRUCTURE | NEW STRUCTURE 1 | NEW STRUCTURE 2 |
|---|---|---|---|
| n⁺ a-Si:H | 6nm | 6nm | 6nm |
| i-LAYER (HD=2) | 6nm | – | 6nm |
| i-LAYER (HD=10) | – | 8nm | 8nm |
| GaAs ABSORBER | 2.5μm | 2.5μm | 2.5μm |
| InGaP BSF | 0.2μm | 0.2μm | 0.2μm |

- SAMPLE 1: REFERENCE STRUCTURE
- SAMPLE 2: NEW STRUCTURE 1
- SAMPLE 3: NEW STRUCTURE 2

STEP 1
LOW-T PHOS-DOPED a-Si:H

STEP 2
RTA AT 900C FOR 60s-240s

STEP 3
i-a-Si:H and TCO DEPOSITION

US 9,666,742 B2

SOLAR CELL STRUCTURES HAVING III-V BASE LAYERS

CROSS-REFERENCE TO RELATED APPLICATION(S)

This patent application is a divisional of U.S. patent application Ser. No. 14/500,538 filed Sep. 29, 2014, entitled "III-V PHOTOVOLTAIC ELEMENTS," which is in turn a divisional of U.S. patent application Ser. No. 13/193,260 filed Jul. 28, 2011, entitled "III-V PHOTOVOLTAIC ELEMENTS." The complete disclosures of the aforementioned U.S. patent application Ser. Nos. 13/193,260 and 14/500,538 are expressly incorporated herein by reference in their entireties for all purposes.

FIELD OF THE INVENTION

The present invention relates to the physical sciences, and, more particularly, to solar cell structures comprising III-V absorber materials.

BACKGROUND OF THE INVENTION

Direct gap III-V materials such as gallium arsenide are attractive candidates for making high efficiency solar cells due to their strong absorption properties. The fabrication of high efficiency III-V solar cells can be achieved by epitaxial growth of the structures using various techniques such as metalorganic chemical vapor deposition and molecular beam epitaxy, the cost of which renders them relatively expensive for many terrestrial applications. Alternative approaches have been proposed such as formation of ITO Schottky contacts and zinc diffusion. Such approaches do not, however, provide a platform for manufacturing high efficiency cells due to the lack of proper surface passivation.

SUMMARY OF THE INVENTION

Principles of the invention provide techniques for improving solar cell performance and for solar cell structures that exhibit improved carrier collection efficiency at the heterointerface. In one aspect, an exemplary method includes the steps of obtaining a doped, p-type III-V base layer, depositing an n+ amorphous hydrogenated silicon layer or n+ epitaxial crystalline Si on the base layer, and annealing the sample, thereby forming an emitter layer comprising an n+ region in the base layer and an n+ epitaxial layer adjoining the emitter layer. Further manufacturing steps may include forming an intrinsic amorphous hydrogenated semiconductor layer on the n+ epitaxial layer and a transparent conductive layer such as a TCO over the intrinsic amorphous hydrogenated semiconductor layer.

A further exemplary method includes obtaining a doped, III-V base layer and forming an intrinsic hydrogenated epitaxial semiconductor layer comprising $Si_xGe_{1-x}$ wherein x is between 0 and 1 on the base layer by plasma enhanced chemical vapor deposition at a temperature below 400° C. An intrinsic amorphous semiconductor layer comprising $Si_xGe_{1-x}$:H, wherein x' is between 0 and 1 is formed on the intrinsic epitaxial semiconductor layer and an emitter layer is formed on the intrinsic amorphous semiconductor layer.

Photovoltaic elements are provided in accordance with further exemplary embodiments of the invention. In one such embodiment, a solar cell structure is provided that comprises a doped III-V absorber layer, an epitaxial, intrinsic semiconductor layer adjoining the absorber layer, an emitter layer above the epitaxial, intrinsic semiconductor layer, and a transparent conductive layer above the emitter layer. The intrinsic, epitaxial semiconductor layer may comprise $Si_xGe_{1-x}$ wherein x is between 0 and 1. An intrinsic amorphous semiconductor layer preferably adjoins the intrinsic, epitaxial semiconductor layer and may be comprised of $Si_xGe_{1-x}$:H, wherein x' is between 0 and 1. The emitter layer may be comprised of $Si_yGe_{1-y}$:H, wherein y is between 0 and 1.

In accordance with a further exemplary embodiment, a solar cell structure comprises a p-type III-V base layer and an n+ III-V emitter layer adjoining the base layer. An n+ epitaxial layer adjoins the emitter layer, the n+ epitaxial layer comprising $Si_xGe_{1-x}$ wherein x is between 0 and 1. An intrinsic amorphous semiconductor layer comprised of $Si_yGe_{1-y}$:H wherein y is between 0 and 1 adjoins the n+ epitaxial layer and a transparent conductive layer is above the intrinsic amorphous semiconductor layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects, including methods of making high efficiency solar cells having particular utility in solar panels. The resulting structures can, however, be used for energy autonomous solar-powered electronic circuits and sensors. One or more embodiments may provide one or more of the following advantages:

Improving open circuit voltage ($V_{oc}$)
Improving the short circuit current density ($J_{sc}$)
Improving solar cell efficiency (η)
Improving the fill factor (FF)

These and other features and advantages of the present invention will become apparent from the following detailed description of illustrative embodiments thereof, which is to be read in connection with the accompanying drawings.

DETAILED DESCRIPTION OF PREFERRED EMBODIMENTS

Heterojunction III-V solar cell structures based on a-Si:H/III-V heterostructures offer a path for low-cost, high efficiency PV (photovoltaic) technology when implemented in conjunction with a layer transfer technique. The use of a-Si:H as an intrinsic layer (i-a:Si:H) can significantly improve the surface passivation of GaAs. US Pub. No. 2010/0307572 entitled "Heterojunction III-V Photovoltaic Cell Fabrication", the disclosure of which is incorporated by reference herein, discloses techniques for forming single and double heterojunction III-V PV cells.

Figure 4:
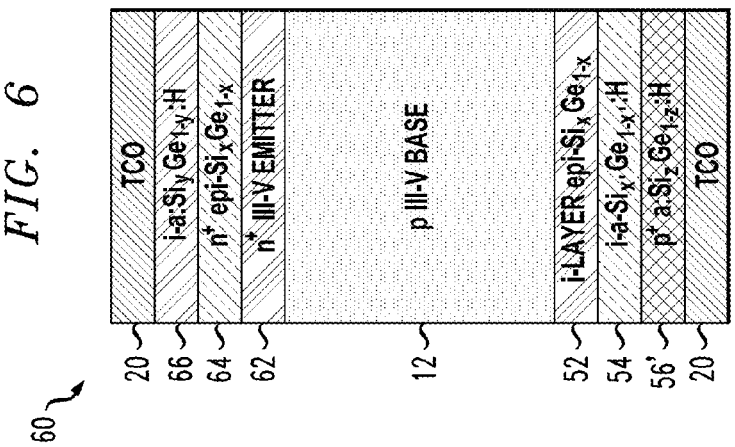
FIG. 4 is a schematic illustration of a solar cell structure including an intrinsic, amorphous semiconductor layer on a III-V base.

FIG. 4 shows a solar cell structure 10 that can be produced using techniques disclosed in US Pub. No. 2010/0307572. The structure 10 includes a base layer 12 comprising a doped III-V substrate that may be n-type or p-type. Doped amorphous silicon layers 18, 18' are formed on intrinsic amorphous silicon layers 16 on the base layer 12. The amorphous silicon layers 18, 18' may have doping types that are the same or opposite from the doping type of the base layer. If the doping type of an amorphous silicon layer is opposite to that of the base layer, the amorphous silicon layer will function as an emitter. In the structure shown in FIG. 4, one of the amorphous silicon layers 18' has the same doping type as the base layer while the other amorphous silicon layer has the opposite doping type. Transparent layers 20 such as a transparent conducting oxide (TCO) are formed on the amorphous silicon layers 18. Front metal contacts including fingers and bus bars (not shown) may be formed on the transparent layers. Although the i-a:Si:H layers 16 improve surface passivation of the GaAS base layer, the relatively high interface trap density at the i-a:Si:H/GaAs heterointerface leads to a significantly high dark current, degrading the open circuit voltage.

Figures 1, 2:
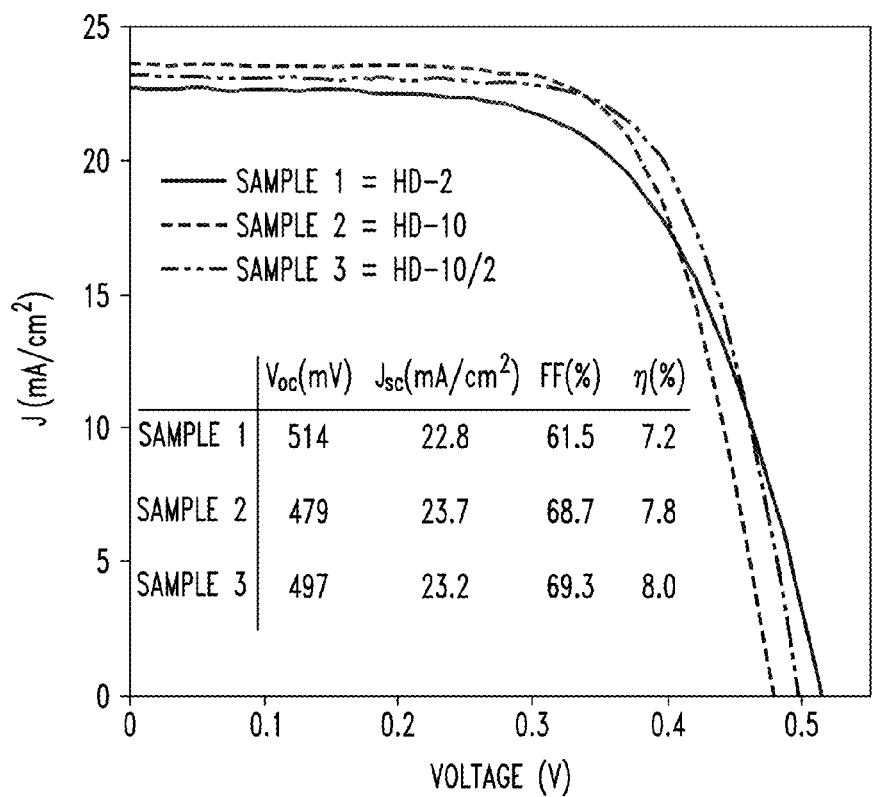
FIG. 1 includes a chart describing three exemplary single heterojunction solar cell structures.
FIG. 2 includes a graph illustrating various properties of the exemplary structures shown in FIG. 1.

FIG. 1 includes a chart relating to three structures, one of which is similar to that shown in FIG. 4 in that an intrinsic amorphous semiconductor layer adjoins a III-V base and a doped hydrogenated amorphous silicon layer is formed over the intrinsic semiconductor layer. The intrinsic semiconductor layer of this "Sample 1" or "Reference Structure" has a relatively low hydrogen dilution (HD) ratio, resulting in an amorphous structure. The structure includes an InGaP back surface field (BSF). Specific thicknesses are provided for the layers of the "Reference Structure" of FIG. 1 to facilitate performance comparisons to the other two structures, each of which has corresponding layers of equal thickness. Those of ordinary skill in the art will appreciate that the layers may be provided in different thicknesses.

The structures identified in FIG. 1 as "New Structure 1" and "New Structure 2" are examples of single heterojunction structures that may be provided in accordance with the invention. It will, however, be appreciated that the principles of the invention can also be applied to double heterojunction solar cell structures. Both structures include intrinsic semiconductor layers adjoining a GaAs absorber. These intrinsic semiconductor layers are epitaxial and were grown at relatively high hydrogen dilution ratios at below 200° C. using plasma enhanced chemical vapor deposition (PECVD). New Structure 2 further includes an amorphous hydrogenated intrinsic semiconductor layer having a relatively low hydrogen dilution ratio that overlies the epitaxial layer. The variations in the hydrogen dilution ratios of the epitaxial and amorphous i-Si:H layers is achieved by varying the hydrogen gas flow while flowing the silicon precursor (silane ($SiH_4$) in this illustrative embodiment) at a fixed rate. The low temperature epitaxial growth of Si containing carbon, germanium or other elements is discussed further in U.S. application Ser. No. 13/032,866 filed Feb. 23, 2011 and entitled LOW-TEMPERATURE SELECTIVE EPITAXIAL GROWTH OF SILICON FOR DEVICE INTEGRATION, the disclosure of which is incorporated by reference herein.

FIG. 2 provides various performance parameters for the three structures described in FIG. 1. The graph shows the short circuit current density as a function of voltage. The open circuit voltage, short circuit current density, fill factor and efficiency of the three structures are provided in chart form. While $V_{oc}$ for Sample 1 (the "Reference Structure") is greater than in Samples 2 and 3, the short circuit current density, fill factor and efficiency of Samples 2 and 3 exceed that of Sample 1.

Figure 3:
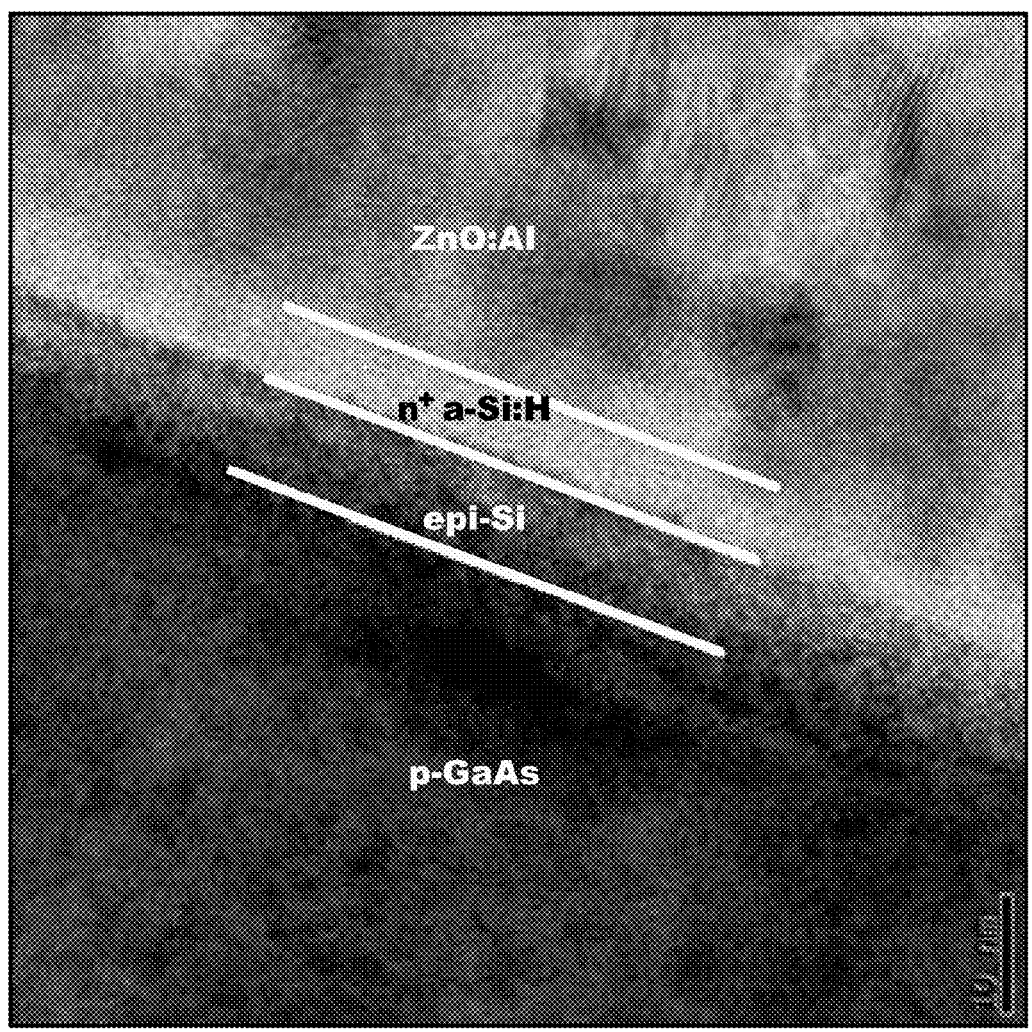
FIG. 3 is a cross sectional view of one the exemplary structures shown in FIG. 1 using a transmission electron microscope (TEM)

A TEM image of Sample 2 (New Structure 1) is provided in FIG. 3. The p-GaAS absorber layer, the epitaxial instrinsic semiconductor layer, the emitter layer (n+ a-Si:H) and a TCO layer comprised of ZnO:Al are delineated in this figure. The BSF does not appear in the image. In this embodiment, the epitaxial hydrogenated intrinsic silicon layer is grown at 150° C.

It will be appreciated that the III-V absorber layer of New Structure 1 or New Structure 2 could be $In_xGa_{1-x}As$ with x ranging from 0 to 0.53. The back contact employed can be selected from conventional back surface fields known to those of ordinary skill in the art.

Figure 5:
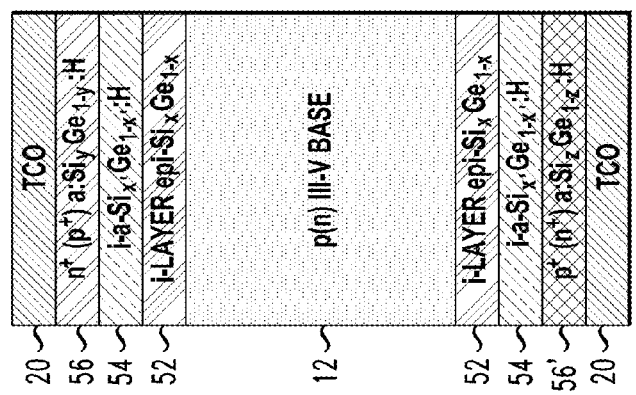
FIG. 5 is a schematic illustration of a solar cell structure in accordance with an embodiment of the invention.

FIG. 5 shows a solar cell structure 50 in accordance with a further embodiment of the invention. Certain layers of the structure 50 also found in the solar cell structure 10 shown in FIG. 4 are designated with the same reference numerals. The solar cell structure 50 includes a doped III-V base 12 such as GaAs or $In_xGa_{1-x}As$ where x can range from 0-0.53. The absorbing material comprising the base can alternatively be $In_yGa_{1-y}P$ where y ranges from 0.4 to 1. The base doping level is from 1e14-1e18/$cm^3$. Intrinsic semiconductor layers 52 comprised of epitaxial $Si_xGe_{1-x}$ adjoin the base. These layers 52 contain hydrogen if grown using PECVD. The value of x may be between 0 and 1, preferably 0-0.5, for these layers 52. The deposition temperature of these epitaxial layers 52 is between 150-400° using PECVD. The preferred thickness of the epitaxial layers is 3-15 nm. Epitaxial SiGe layers 52 containing less than 35% Ge can be grown using conventional CVD at temperatures exceeding 600° C. The layers 52 do not contain hydrogen if grown using CVD. Low temperature PECVD growth of the epitaxial layers is preferred to allow low temperature fabrication of heterojunction III-V solar cells and is particularly important for applications such as flexible solar cells.

Intrinsic hydrogenated amorphous semiconductor layers 54 comprised of $Si_{x'}Ge_{1-x'}$:H adjoin the intrinsic epi-$Si_xGe_{1-x}$ layers in this preferred embodiment, where x' is between 0 and 1 and preferably between 0 and 0.5. These layers can be deposited using PECVD or hot-wire chemical vapor deposition including appropriate source materials. In one embodiment, the intrinsic hydrogenated amorphous semiconductor layers 54 are deposited in a process chamber containing a semiconductor precursor source gas and a carrier gas including hydrogen. Hydrogen atoms within the carrier gas are incorporated into the deposited material to form the intrinsic hydrogenated semiconductor containing material of the intrinsic semiconductor layer. The germanium content in the hydrogenated amorphous SiGe layers 54 may be different from the epitaxial layers 52. Carbon atoms can be incorporated in the amorphous semiconductor layers with or in place of germanium. The germanium and carbon content can be graded. The amorphous semiconductor layers can each be comprised of multi-layer structures with different compositions. If carbon is used in place of germanium in the above-referenced formula, the value of x' would be 0 to 0.6 and preferably 0 to 0.3.

A doped hydrogenated amorphous emitter layer 56 adjoins one of the two amorphous semiconductor layers. Its doping type is opposite to that of the base 12. This layer 56 is comprised of a-$Si_yGe_{1-y}$:H where y is between 0 and 1 and preferably between 0 and 0.5. A back surface field layer 56' adjoins the other of the two intrinsic hydrogenated amorphous semiconductor layers 54. Its doping type is the same as the doping type of the base 12. This layer is comprised of a-$Si_zGe_{1-z}$:H where z is between 0 and 1 and preferably between 0 and 0.5.

Transparent conductive layers 20 adjoin the emitter and back surface field layers 56,56'. The transparent layers are comprised of conductive material that is transparent in the range of electromagnetic radiation at which photogeneration of electrons and holes occur within the solar cell structure 50. The transparent conductive layer 20 in the exemplary embodiment of FIG. 5 may comprise TCO's such as indium tin oxide (ITO), tin oxide (SnO), fluorine-doped tin oxide ($SnO_2$:F) or aluminum-doped zinc oxide (ZnO:Al). Transparent conducting films such as carbon nanotube-based films and graphene-based films may alternatively be employed to form this transparent conductive layer 20. These examples are to be considered exemplary as opposed to limiting. The thickness of the transparent conductive layer may vary depending on the type of transparent conductive material employed as well as the technique used in forming this layer. Typically, and in one exemplary embodiment, the thickness of the transparent conductive layer 20 is between 20-500 nm. Other thicknesses, including those less than 20 nm and/or greater than 500 nm, can alternatively be employed. The preferred thickness of the transparent conductive layer for minimizing reflection from the surface of Si is in the range of 70-110 nm for a TCO. Nanotube and graphene-based films may in the range of 2-50 nm. The transparent conductive layer is typically formed using a deposition process such as sputtering or CVD. Examples of CVD processes usable for a number of types of such layers include APCVD, LPCVD, PECVD, MOCVD and combinations thereof. RF and DC magnetron sputtering are among other techniques for forming the transparent conductive layer 20.

The hydrogenated amorphous SiGe layers 56,56' may be formed from precursor gases such as $SiH_4$, $SiF_4$, or $H_2SiCl_2$ (DCS). Germane is a known precursor for forming layers comprising germanium. The layers may be doped "in situ" by adding a dopant gas containing dopant atoms in the gas mixture. The dopant atoms are incorporated into the deposited material to form a hydrogenated doped semiconductor. Examples of dopant gases containing p-type dopant atoms are $B_2H_6$ and $B(CH_3)_3$ (TMB). Examples of an n-type dopant gas include $AsH_3$ and $PH_3$. The n-type dopant concentration in certain layer(s) of the structure 50 ranges from $10^{16}$ atoms/$cm^3$ to $10^{21}$ atoms/$cm^3$, with the range of $10^{18}$-$10^{20}$ atoms/$cm^3$ being a typical range. The doping efficiency (the ratio of activated dopant atoms to the total dopant atoms) typically ranges from 0.1%-20%, although higher and lower doping efficiencies are possible. The doping efficiency is generally decreased by increasing the dopant atom concentration. The p-type dopant concentration likewise ranges from $10^{16}$-$10^{21}$ atoms/$cm^3$ with the range of $10^{18}$-$10^{20}$ atoms/$cm^3$ being typical. In this exemplary embodiment, the layer 56 above the base layer 12 functions as an emitter and the layer 56' below the base layer as a back surface field (BSF).

Figure 6:
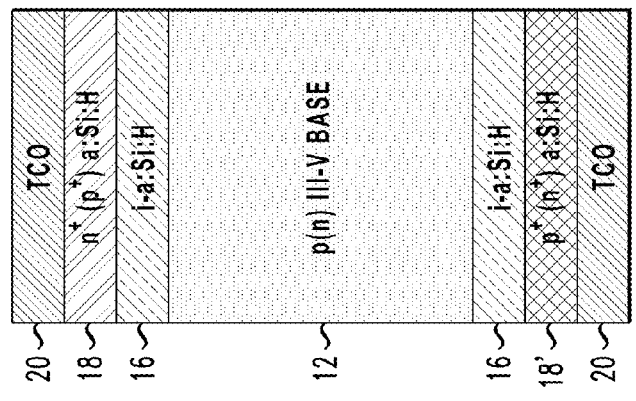
FIG. 6 is a schematic illustration of a solar cell structure in accordance with a further embodiment of the invention.

FIG. 6 schematically illustrates a solar cell structure 60 in accordance with a further exemplary embodiment of the invention. This embodiment includes a p-type III-V base layer 12. A high interface state or trap density ($D_{it}$) limits performance of a solar cell structure by reducing $V_{oc}$. The solar cell structure 60 helps to overcome such performance limits. A shallow junction n+ III-V emitter layer 62 can be formed on the base layer through epitaxial growth or introduction of n-type doping impurities into the base layer 12 through ion implantation or diffusion. Epitaxial methods include chemical vapor deposition such as MOCVD and molecular beam epitaxy (MBE). The second possible method includes the introduction of n-type doping impurities such as Si, Ge, Te or S into the p-type base layer 12 via ion implantation and activation annealing at elevated temperatures in the range of 450-1000° C. Alternatively, the impurities can be diffused out of an impurity-rich layer into the p-type base layer. The impurity-rich layer could be, for example, a-$Si_{1-x}Ge_x$ or a thin sulfur layer. The diffusion temperature varies depending on the type of the impurity and ranges between 500-1000° C. The thickness of the n+ emitter layer 62 formed via epitaxy, ion implantation or diffusion ranges from 5-50 nm. Doping concentrations may be in the same ranges as in the embodiment of FIG. 5.

Figure 8:
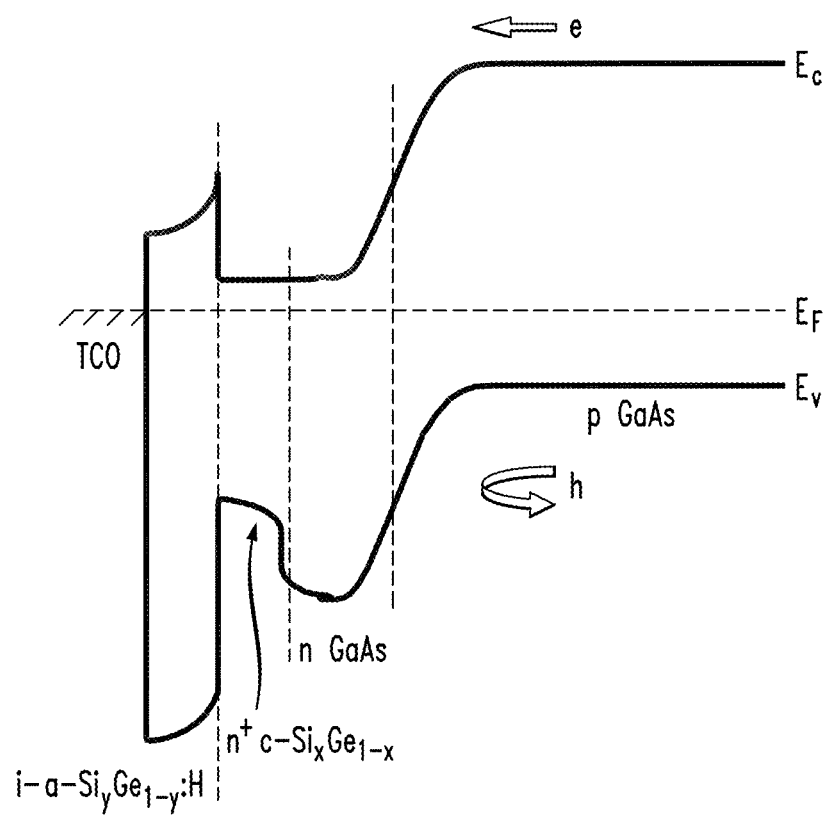
FIG. 8 is an energy band diagram relating to the solar cell structure shown in FIG. 6.

An n+ epi-$Si_xGe_{1-x}$ layer 64 is formed on the emitter layer 62 where x is between 0 and 1 and preferably between 0 and 0.5. This layer may, but does not necessarily contain hydrogen, the presence of hydrogen depending on growth conditions. The conduction band edge of the III-V base 12 (GaAs in this exemplary embodiment) and the n+ epi-$Si_xGe_{1-x}$ layer 64 are aligned. In other words, the energy difference between the conduction band and vacuum is about the same for both regions. (See FIG. 8.) $V_{oc}$ degradation is thereby reduced. An intrinsic amorphous hydrogenated semiconductor layer 66 adjoins the n+ epi-$Si_xGe_{1-x}$ layer 64. The i-a:$Si_yGe_{1-y}$:H layer 66 (where y is between 0 and 1, preferably between 0 and 0.5) provides surface passivation of the adjoining n+ epi-$Si_xGe_{1-x}$ layer. The remaining layers of the solar cell structure 60 in this embodiment are the same as those found in the structure 50 according to the embodiment of FIG. 5 and have been designated with the same reference numbers in the drawings.

Figure 7A:
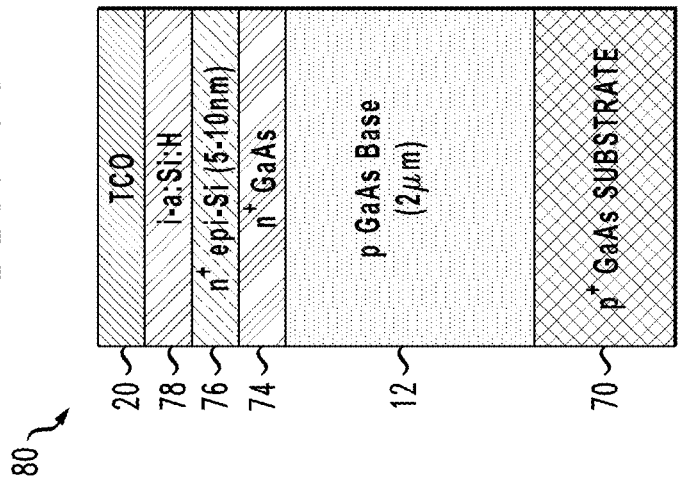
FIGS. 7A-7C illustrate a process for forming an exemplary solar cell structure in accordance with an embodiment of the invention.
Figure 7B:
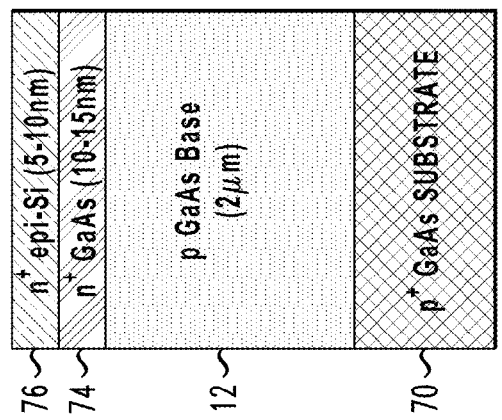
Figure 7C:
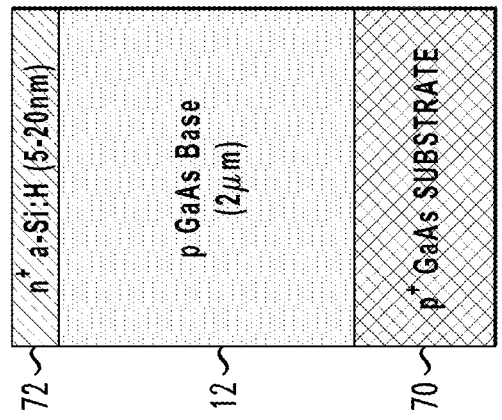

FIGS. 7A-7C show several steps employed in the manufacture of an exemplary solar cell structure having a p-type III-V base layer and a novel emitter layer in accordance with the invention. It will be appreciated that the structure may include an appropriate back surface field region at the rear section of the structure.

Referring to FIG. 7A, a p-type GaAs base layer 12 is formed on a p+ GaAs substrate 70. The front contact (emitter layer) for the structure is formed by depositing a 5-20 nm thick n+ a-Si:H layer 72 as an impurity rich material on the base layer. In this exemplary embodiment, the n+ a-Si:H layer 72 is phosphorus doped, but could alternatively be doped with arsenic. The structure shown in FIG. 7A is subjected to rapid thermal annealing (RTA) at elevated temperatures as shown in FIG. 7B. In this exemplary embodiment, the annealing temperature is 900° C. and the annealing time is 60-240 seconds. Upon annealing, some silicon atoms diffuse into the GaAs base to form an n+ region 74 about 10-15 nm deep while the a-Si:H layer becomes single-crystalline through a solid-phase epitaxy process, forming the n+ epi-Si layer 76 shown in FIG. 7B. This layer 76 is unlikely to contain hydrogen as Si:H bonds are volatile above 400-500° C. An intrinsic semiconductor layer (i-a-Si:H) 78 is formed on the n+ epi-Si layer 76 and a transparent conductive layer 20 is formed on the intrinsic amorphous semiconductor layer 78 to provide the structure 80 shown in FIG. 7C. In this exemplary embodiment, the transparent conductive layer 20 is a TCO such as ZnO:Al. $V_{oc}$ of the resulting structure 80 is 920 mV.

The method as described with respect to FIGS. 7A-7C can be effected by depositing an n+ epitaxial crystalline layer on the p-type base layer rather than the n+ a-Si:H layer, followed by annealing of the sample.

Given the discussion thus far, it will be appreciated that, in general terms, an exemplary method, according to an aspect of the invention, includes the step of obtaining a doped, p-type III-V base layer such as that shown in FIG. 7A. An n+ amorphous hydrogenated silicon layer is deposited on the base layer, also as shown in FIG. 7A. The base layer and the n+ amorphous hydrogenated silicon layer are annealed, preferably by rapid thermal annealing, forming an emitter layer 74 comprising an n+ region in the base layer and an n+ epitaxial layer 76 adjoining the emitter layer as shown in FIG. 7B. Further manufacturing steps may include forming an intrinsic amorphous hydrogenated semiconductor layer 78 on the n+ epitaxial layer and a transparent conductive layer 20 such as a TCO over the intrinsic amorphous hydrogenated semiconductor layer to provide the photovoltaic element shown in FIG. 7C.

A further exemplary method in accordance with the invention may be employed to form at least part of the solar cell structure 50 shown in FIG. 5. The exemplary method includes obtaining a doped, III-V base layer and forming an intrinsic hydrogenated epitaxial semiconductor layer comprising $Si_xGe_{1-x}$ wherein x is between 0 and 1 on the base layer by plasma enhanced chemical vapor deposition at a temperature below 400° C. An intrinsic amorphous semiconductor layer comprising $Si_{x'}Ge_{1-x'}$:H, wherein x' is between 0 and 1 is formed on the intrinsic epitaxial semiconductor layer and an emitter layer is formed on the intrinsic amorphous semiconductor layer. As discussed above, the method may further include forming a transparent conductive layer on the emitter layer. The method may include further steps depending on whether a single or double heterojunction solar cell structure is desired.

In accordance with a further aspect of the invention, a solar cell structure is provided that comprises a doped III-V absorber layer such as the GaAs absorber described with respect to FIG. 1. An epitaxial, intrinsic semiconductor layer comprising hydrogenated silicon adjoins the absorber layer as described above with respect to New Structures 1 and 2 of FIG. 1. An emitter layer is above the epitaxial, intrinsic semiconductor layer and a transparent conductive layer is above the emitter layer as shown in FIG. 3.

A solar cell structure provided in accordance with another aspect of the invention comprises a doped III-V base layer and an intrinsic hydrogenated epitaxial semiconductor layer comprising $Si_xGe_{1-x}$ wherein x is between 0 and 1, the intrinsic hydrogenated epitaxial semiconductor layer adjoining the base layer. FIG. 5 provides an exemplary embodiment of a structure 50 having such a base layer 12 and epitaxial layer 52. An intrinsic amorphous semiconductor layer adjoins the intrinsic hydrogenated epitaxial semiconductor layer and comprised of $Si_{x'}Ge_{1-x'}$:H, wherein x' is between 0 and 1. Layer 54 in the structure 50 shown in FIG. 5 is exemplary of such a layer. A doped amorphous emitter layer comprised of $Si_yGe_{1-y}$:H, wherein y is between 0 and 1, is located above the intrinsic amorphous semiconductor layer and a transparent conductive layer is positioned above the doped amorphous emitter layer. Layers 56 and 20 in FIG. 5, respectively, illustrate corresponding structures. A structure including the above-referenced layers can be incorporated in either a single or double heterojunction solar cell structure.

A solar cell structure in accordance with a further aspect of the invention includes a p-type III-V base layer, an n+ III-V emitter layer adjoining the base layer, and an n+ epitaxial layer adjoining the emitter layer. The n+ epitaxial layer comprises $Si_xGe_{1-x}$ wherein x is between 0 and 1. An intrinsic amorphous semiconductor layer adjoins the n+ epitaxial layer and is comprised of $Si_yGe_{1-y}$:H wherein y is between 0 and 1. A transparent conductive layer is located above the intrinsic amorphous semiconductor layer. FIG. 6 shows such a structure. In the embodiment of FIG. 6, the structure further includes an intrinsic epitaxial semiconductor layer 52 comprising $Si_xGe_{1-x}$ adjoining the base layer, an intrinsic amorphous semiconductor layer 54 comprising $Si_{x'}Ge_{1-x'}$:H, an amorphous back surface field layer 56' comprising $Si_zGe_{1-z}$:H below the intrinsic amorphous semiconductor layer (wherein z is between 0 and 1), and a transparent conductive layer 20 (a TCO in this exemplary embodiment) below the amorphous back surface field layer. FIG. 7C shows another exemplary embodiment of such a structure wherein the base and emitter layers 12, 74 both comprise GaAs and the intrinsic amorphous semiconductor layer 78 is i-a:Si:H.

Those skilled in the art will appreciate that the exemplary structures discussed above can be distributed in raw form or incorporated as parts of intermediate products or end products that benefit from having photovoltaic elements therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A solar cell structure comprising:
   a doped III-V absorber layer;
   an epitaxial, intrinsic semiconductor layer adjoining a top surface of the absorber layer and comprising $Si_xGe_{1-x}$ wherein x is between 0 and 1;

an amorphous, intrinsic semiconductor layer adjoining a top surface of the epitaxial, intrinsic semiconductor layer, the amorphous, intrinsic semiconductor layer comprising $Si_xGe_{1-x}$:H, wherein x' is between 0 and 1;
an emitter layer above the epitaxial, intrinsic semiconductor layer, and
a transparent conductive layer above the emitter layer.

2. The solar cell structure of claim 1, wherein the epitaxial, intrinsic semiconductor layer contains hydrogen.

3. The solar cell structure of claim 1, wherein the emitter layer comprises a doped, amorphous hydrogenated layer adjoining a top surface of the amorphous, intrinsic semiconductor layer.

4. The solar cell structure of claim 1, wherein the epitaxial, intrinsic semiconductor layer is hydrogenated, and wherein the amorphous, intrinsic semiconductor layer includes carbon atoms.

5. The solar cell structure of claim 1, wherein x is between 0 and 0.5 x' is between 0 and 0.5.

6. The solar cell structure of claim 5, wherein the emitter layer is comprised of doped, amorphous $Si_yGe_{1-y}$:H, wherein y is between 0 and 1.

7. The solar cell structure of claim 6, wherein x is between 0 and 0.5.

8. The solar cell structure of claim 7, wherein y is between 0 and 0.5.

9. The solar cell structure of claim 6, wherein y is between 0 and 0.5.

10. The solar cell structure of claim 5, wherein the base layer comprises GaAs.

11. The solar cell structure of claim 5, further including a back surface field below the base layer.

12. A solar cell structure comprising:
a p-type III-V base layer;
an n+ III-V emitter layer adjoining the base layer;
an n+ epitaxial layer adjoining the emitter layer, the n+ epitaxial layer comprising $Si_xGe_{1-x}$ wherein x is between 0 and 1, the emitter layer being positioned between the base layer and the n+ epitaxial layer;
an intrinsic amorphous semiconductor layer adjoining the n+ epitaxial layer and comprised of $Si_yGe_{1-y}$:H wherein y is between 0 and 1, and
a transparent conductive layer above the intrinsic amorphous semiconductor layer, the intrinsic amorphous semiconductor layer being positioned between the transparent conductive layer and the n+ epitaxial layer.

13. The solar cell structure of claim 12, wherein the base layer and the emitter layer comprise GaAs, the emitter layer contains silicon atoms and x is greater than 0.

14. The solar cell structure of claim 12, wherein x is between 0 and 0.5, and further wherein a conduction band edge of the base layer and of the n+ epitaxial layer are aligned.

15. The solar cell structure of claim 14, wherein y is between 0 and 0.5.

16. The solar cell structure of claim 12, further including:
an intrinsic epitaxial semiconductor layer comprising $Si_xGe_{1-x}$ adjoining the base layer;
a second intrinsic amorphous semiconductor layer comprising $Si_{x'}Ge_{1-x'}$:H wherein x' is between 0 and 1, the second intrinsic amorphous semiconductor layer adjoining the intrinsic epitaxial semiconductor layer;
an amorphous back surface field layer comprising $Si_zGe_{1-z}$:H below the intrinsic amorphous semiconductor layer wherein z is between 0 and 1, and
a transparent conductive layer below the amorphous back surface field layer.

17. The solar cell structure of claim 16, wherein x, x', y and z are between 0 and 0.5.

18. The solar cell structure of claim 16, wherein the base layer and the emitter layer comprise GaAs and further wherein a conduction band edge of the base layer and of the n+ epitaxial layer are aligned.

19. A solar cell structure comprising:
a doped III-V absorber layer;
a first epitaxial, intrinsic semiconductor layer adjoining a top surface of the absorber layer and comprising $Si_xGe_{1-x}$ wherein x is between 0 and 1;
a doped, amorphous emitter layer above the epitaxial, intrinsic semiconductor layer such that the first epitaxial, intrinsic semiconductor layer is between the top surface of the absorber layer and the emitter layer, and
a transparent conductive layer above the emitter layer.

20. The solar cell structure of claim 19, further including a second epitaxial, intrinsic semiconductor layer adjoining a bottom surface of the absorber layer and comprising $Si_xGe_{1-x}$, both the first and second epitaxial, intrinsic semiconductor layers containing hydrogen, and a doped, amorphous back surface field layer below the second epitaxial, intrinsic semiconductor layer, the emitter layer comprising amorphous $Si_yGe_{1-y}$:H wherein y is between 0 and 1 and the back surface field layer comprising amorphous $Si_zGe_{1-z}$:H, wherein z is between 0 and 1.

* * * * *